(12) United States Patent
Anderson et al.

(10) Patent No.: US 8,299,534 B2
(45) Date of Patent: Oct. 30, 2012

(54) FET WITH REPLACEMENT GATE STRUCTURE AND METHOD OF FABRICATING THE SAME

(75) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/229,273

(22) Filed: Sep. 9, 2011

(65) Prior Publication Data

US 2011/0316084 A1 Dec. 29, 2011

Related U.S. Application Data

(62) Division of application No. 12/491,649, filed on Jun. 25, 2009, now Pat. No. 8,053,318.

(51) Int. Cl.
*H01L 29/78* (2006.01)
(52) U.S. Cl. ........................................ 257/366; 257/365
(58) Field of Classification Search .................. 257/365, 257/366
See application file for complete search history.

(56) References Cited

U.S. PATENT DOCUMENTS

| 5,874,328 | A | 2/1999 | Liu et al. |
| 6,855,582 | B1 * | 2/2005 | Dakshina-Murthy et al. ............ 438/157 |
| 6,974,729 | B2 | 12/2005 | Collaert et al. |
| 7,067,868 | B2 | 6/2006 | Thean et al. |
| 7,071,064 | B2 | 7/2006 | Doyle et al. |
| 7,279,375 | B2 | 10/2007 | Radosavljevic et al. |
| 2005/0085070 | A1 | 4/2005 | Park |
| 2007/0298549 | A1 | 12/2007 | Jurczak et al. |
| 2008/0116515 | A1 | 5/2008 | Gossner et al. |

* cited by examiner

*Primary Examiner* — Douglas Menz
(74) *Attorney, Agent, or Firm* — Richard Kotulak; Roberts Mlotkowski Safran & Cole, P.C.

(57) ABSTRACT

A MUGFET and method of manufacturing a MUGFET is shown. The method of manufacturing the MUGFET includes forming temporary spacer gates about a plurality of active regions and depositing a dielectric material over the temporary spacer gates, including between the plurality of active regions. The method further includes etching portions of the dielectric material to expose the temporary spacer gates and removing the temporary spacer gates, leaving a space between the active regions and a remaining portion of the dielectric material. The method additionally includes filling the space between the active regions and above the remaining portion of the dielectric material with a gate material.

17 Claims, 4 Drawing Sheets

FET WITH REPLACEMENT GATE STRUCTURE AND METHOD OF FABRICATING THE SAME

CROSS REFERENCE TO RELATED APPLICATIONS

The present application is a divisional application of co-pending U.S. application Ser. No. 12/491,649, filed on Jun. 25, 2009, the contents of which are incorporated by reference in its entirety herein.

FIELD OF THE INVENTION

The invention relates to a replacement gate structure for a field effect transistor (FET) and method of manufacturing, and more particularly, to a multi-gate FET replacement gate structure and method of fabricating the multi-gate FET replacement gate structure.

BACKGROUND

A Multi-gate FET (MUGFET) is a family of MOSFETs in which more than one gate contact is used to control output current. MUGFETs are known to have superior gate control of the channel compare to single gate MOSFETs. For example, in a multigate device, the channel is surrounded by several gates on multiple surfaces, allowing more effective suppression of "off-state" leakage current. Multiple gates also allow enhanced current in the "on" state, known as drive current. These advantages translate to lower power consumption and enhanced device performance.

MUGFETs are one of several strategies developed to create ever-smaller microprocessors and memory cells, for example. In fact, many manufactures predict that MUGFET technologies will be the cornerstone of sub-32 nm technologies. The primary roadblock, however, to widespread implementation is manufacturability, as both planar and non-planar designs present processing challenges. These challenges may include lithography and patterning processes, as well as resultant high parasitic S/D resistance.

MUGFETs come in a variety of different architectures. For example, MUGFETs may be planar or non-planar devices. However, at sizes of, for example, 32 nm, planar transistors are expected to suffer from undesirable short channel effects, especially "off-state" leakage current. These off state leakage currents will increase the idle power required by the device. Nonplanar devices, on the other hand, are more compact than conventional planar transistors, enabling higher transistor density which translates to smaller overall microelectronics. But, a challenge to integrate non planar MUGFETs into conventional semiconductor manufacturing processes include, for example, fabrication of a thin silicon "fin" and of matched gates on multiple sides of the fin. Also, in conventional MUGFET devices, there is a large capacitance between the fins, which may result in decreased performance characteristics.

Accordingly, there exists a need in the art to overcome the deficiencies and limitations described hereinabove.

SUMMARY

In an aspect of the invention, a method of manufacturing a structure comprises forming temporary spacer gates about a plurality of active regions and depositing a dielectric material over the temporary spacer gates, including between the plurality of active regions. The method further includes etching portions of the dielectric material to expose the temporary spacer gates and removing the temporary spacer gates, leaving a space between the active regions and a remaining portion of the dielectric material. The method additionally includes filling the space between the active regions and above the remaining portion of the dielectric material with a gate material.

In an aspect of the invention, a method of manufacturing a MUGFET, comprises: forming a plurality of active regions on a substrate; forming a sacrificial spacer gate about each of the active regions; depositing a dielectric material over the sacrificial spacer gate; over etching the dielectric material to form an opening in the dielectric material and to expose the sacrificial spacer gate; etching the sacrificial spacer gate to form spaces between each of the plurality of active regions and the dielectric material which remains between each of the plurality of active regions after the over etching; and depositing gate material in the spaces and the opening.

In an aspect of the invention, a MUGFET structure comprises a dual damascene replacement gate structure having a lower portion and an upper portion. The lower portion has a gate thickness of about 30% or less of a distance between adjacent active devices and the upper portion straps the adjacent active devices.

In another aspect of the invention, a design structure embodied in a machine readable medium for designing, manufacturing, or testing an integrated circuit is provided. The design structure comprises the structures and/or methods of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to a replacement gate structure for a field effect transistor (FET) and method of manufacturing, and more particularly, to a multi-gate FET (MUGFET) replacement gate structure and method of fabricating the MUGFET replacement gate structure. In implementation, the method of manufacture includes a dual damascene MUGFET replacement gate. Advantageously, the method of forming the structures allows the gate to gate strapping of adjacent fins of a MUGFET, while reducing gate to source/drain (S/D) capacitance. Also, the structure of the present invention has a lower capacitance with the source/drain region than conventional devices. The present invention also results in a structure that is non-planar and which straddles the fins of the MUGFET.

Figure 1:
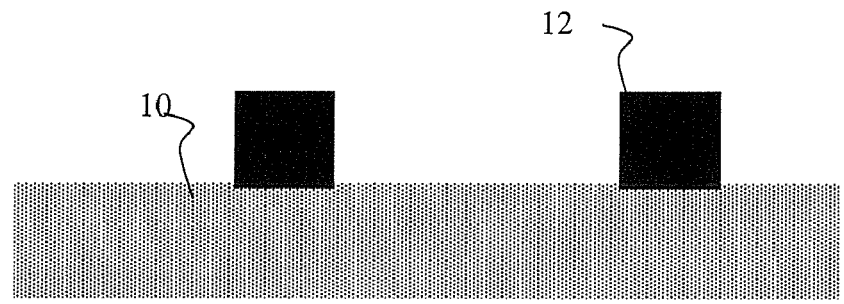
FIGS. 1-6 show intermediate structures and respective processing steps in accordance with aspects of the invention.

FIG. 1 shows a beginning structure in accordance with aspects of the invention. In particular, FIG. 1 shows a plurality of active regions 12 formed on a BOX such as, for example, an SOI layer 10. The active regions 12 can be, for example, fins for a MUGFET. The active regions 12 can be formed in a conventional manner known to those of skill in the art. For example, the fins (active regions 12) can be formed by a conventional masking and etching process, as should be understood by those of skill in the art such that further explanation is not required herein.

The active regions 12 have an aspect ratio, in embodiments, of about 1.5; that is, the height of the active region is about 1.5 times the width of the active region. It should be understood, though, that other aspect ratios are also contemplated by the present invention, and that an aspect ratio of 1.5 should not be considered a limiting feature of the present invention. The spacing between adjacent active regions 12 can be about 2 to 3 times the width of the active region 12. For example, for a 20 nm node, the space between the adjacent active regions can be about 40 nm to 60 nm. Again, it should be understood that other distances are also contemplated by the present invention, and that the present invention should not be limited by the space between the adjacent active regions.

Figure 2:
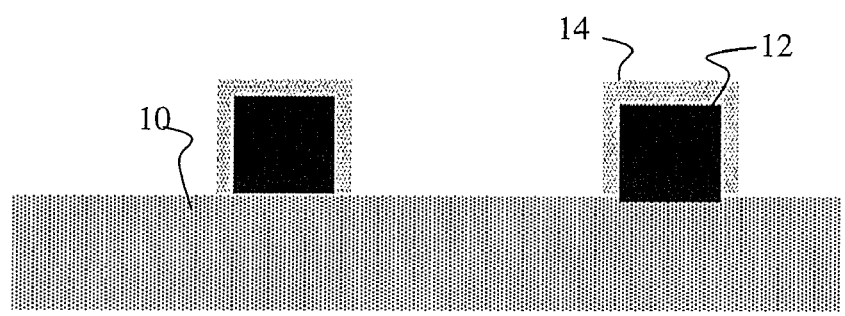

FIG. 2 shows an optional processing step in accordance with aspects of the invention. In particular, FIG. 2 shows the formation of a dielectric and metal region 14 surrounding the active regions 12. The dielectric material can be, for example, any suitable dielectric material such as $SiO_2$, SiON, Hafnium, Zirconium, etc. The metal can be any suitable metal such as, for example, TaN or TiN, to name a few metals. In embodiments, the dielectric and metal region 14 is formed using a conventional deposition and etching process. For example, the dielectric and metal region 14 can be formed by a conventional Atomic Layer Deposition (ALD) and a subsequent etching of excess material on the SOI layer 10.

Figure 3:
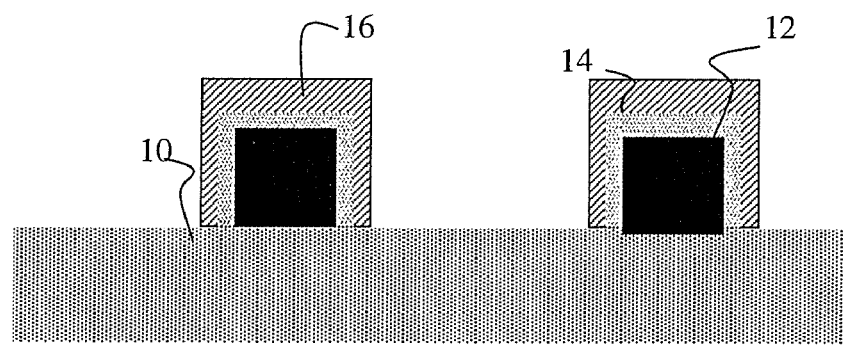

In FIG. 3, a temporary spacer gate 16 (sacrificial gate) is formed to surround the active region 12. The temporary spacer gate 16 will act as a spacer gate, which will subsequently be removed to provide a space between the active region 12 and a dielectric material. This will effectively lower the capacitance of the final structure. In embodiments, the temporary gate 16 is a polysilicon material that is deposited directly over and in contact with either the active regions 12 or the dielectric and metal regions 14, depending on the implementation of the processes discussed in FIG. 2. The spacer gate 16 is etched to remove material from the source/drain region.

In embodiments, the sidewall thickness of the spacer gate 16 is about 10 nm to about 20 nm for a spacing of about 60 nm between adjacent active regions 12. In further embodiments, the spacer gate 16 can be other dimensions such as, for example, 5 nm to about 30 nm. In embodiments, though, the sidewall thickness (and distance between active regions) can vary so long as a space remains between the active region 12 and a dielectric material, as discussed in more detail below. For example, in one contemplated embodiment, the thickness of the sidewall may be about one third (⅓) or less of the spacing between adjacent active regions 12.

Figure 4:
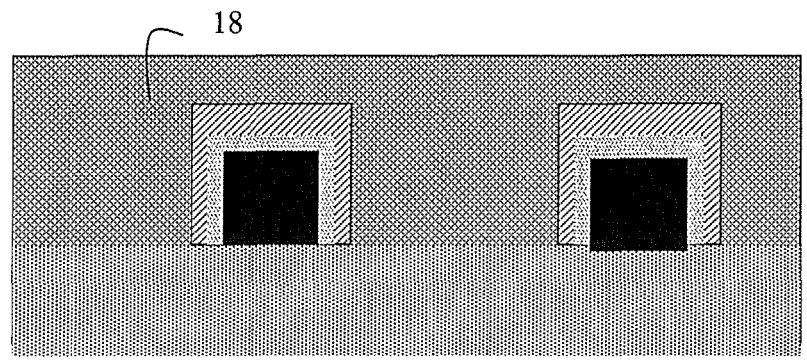

FIG. 4 shows a deposition of dielectric material on the structure of FIG. 3. In particular, using a conventional deposition process such as, for example, CVD, a dielectric material 18 is deposited on the structures shown in FIG. 3. The dielectric material 18 may be any appropriate dielectric material such as, for example, $SiO_2$.

Figure 5:
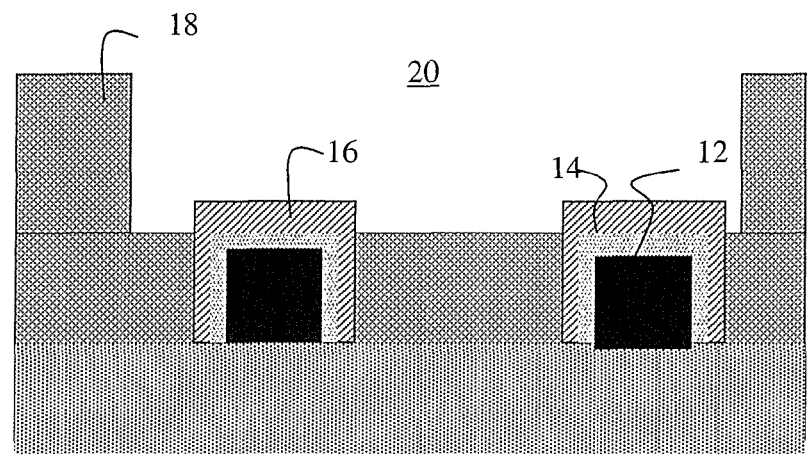

FIG. 5 shows an etching process in accordance with the present invention. More specifically, the dielectric material 18 is etched to form an opening 20 which exposes the temporary spacer gates 16. That is, in embodiments, the dielectric material 18 is etched to expose at least the top of the temporary spacer gates 16. In embodiments, the dielectric material 18 can also be over etched to expose the sidewalls of the temporary spacer gates 16. The etching process can be accomplished using any conventional etchant and etching process appropriate for the dielectric material 18. For example, in one conventional process, a mask (not shown) is applied on the dielectric material 18, which is opened using a conventional lithographic process. The dielectric material 18 is then etched through the opening, to the temporary spacer gates 16.

Figure 6:
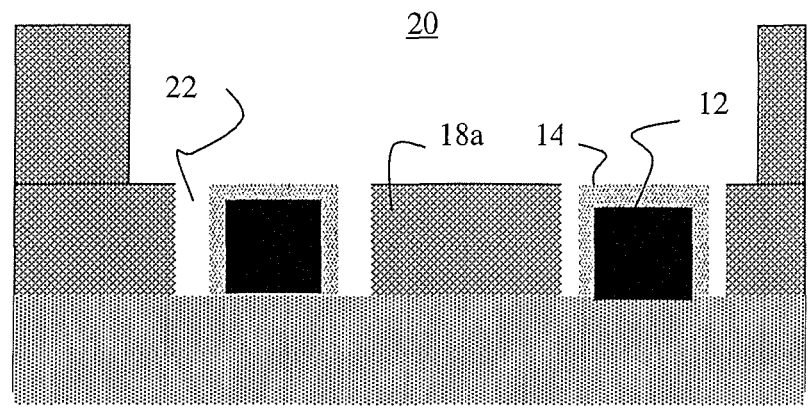

In FIG. 6, the temporary spacer gates 16 are removed using a conventional etching process. More specifically, the temporary spacer gates 16 are removed to form a space 22 between the remaining dielectric material 18a and the adjacent active regions 12 (or dielectric and metal region 14). The temporary spacer gates 16 can be removed using an etchant that is selective to the material of the temporary spacer gate, e.g., selective to polysilicon. After removal of the temporary spacer gates, dielectric material 18a remains between adjacent active regions 12 (or dielectric and metal region 14) with the space 22 provided between the dielectric material 18a and each of the active regions 12.

In embodiments, the etching results in the formation of the space 22 (cavity), which can range from about 10 nm to about 20 nm for a 60 nm spacing between adjacent active regions 12. In embodiments, though, the space 22 can be a different dimension so long as a space remains between the active regions 12 and the dielectric material 18. For example, in one contemplated embodiment, the space 22 can be about one third (⅓) or less than the spacing between adjacent active regions 12.

Figure 7:
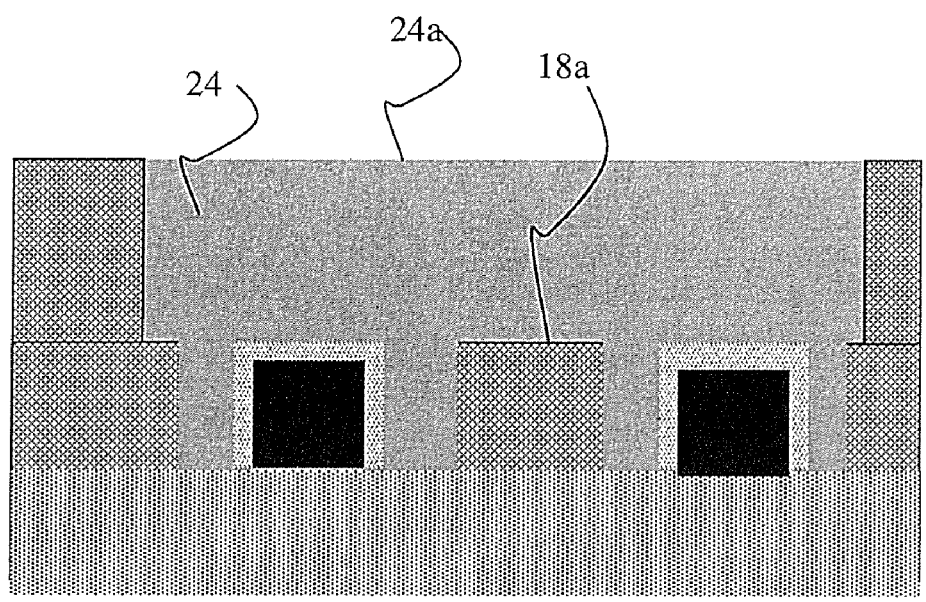
FIG. 7 shows a final structure and respective processing steps in accordance with aspects of the invention.

FIG. 7 shows a final structure and respective processing steps in accordance with the invention. Specifically, after the temporary spacer gates are removed, a replacement gate 24 is deposited in the etched area, e.g., in the space 22 and space 20. The replacement gate 24 can be deposited using a dual damascene deposition process. The replacement gate 24 can be planarized to form a polished flat surface 24a. In embodiments, the replacement gate 24 can be, for example, any appropriate metal depending on the desired work function.

In the structure thus described, the replacement gate 24 straddles (straps) the active regions (fins) 12, with the dielectric material 18a therebetween. Advantageously, the dielectric material 18a, i.e., non-gate material, located between the active regions 12 will lower the capacitance of the device. Also, as the device is tunable, e.g., the spacing can vary (e.g., sidewall thickness of the temporary spacer gate can be adjusted), such that the device can have a capacitance depending on the desired characteristics of the device.

Design Structure

Figure 8:
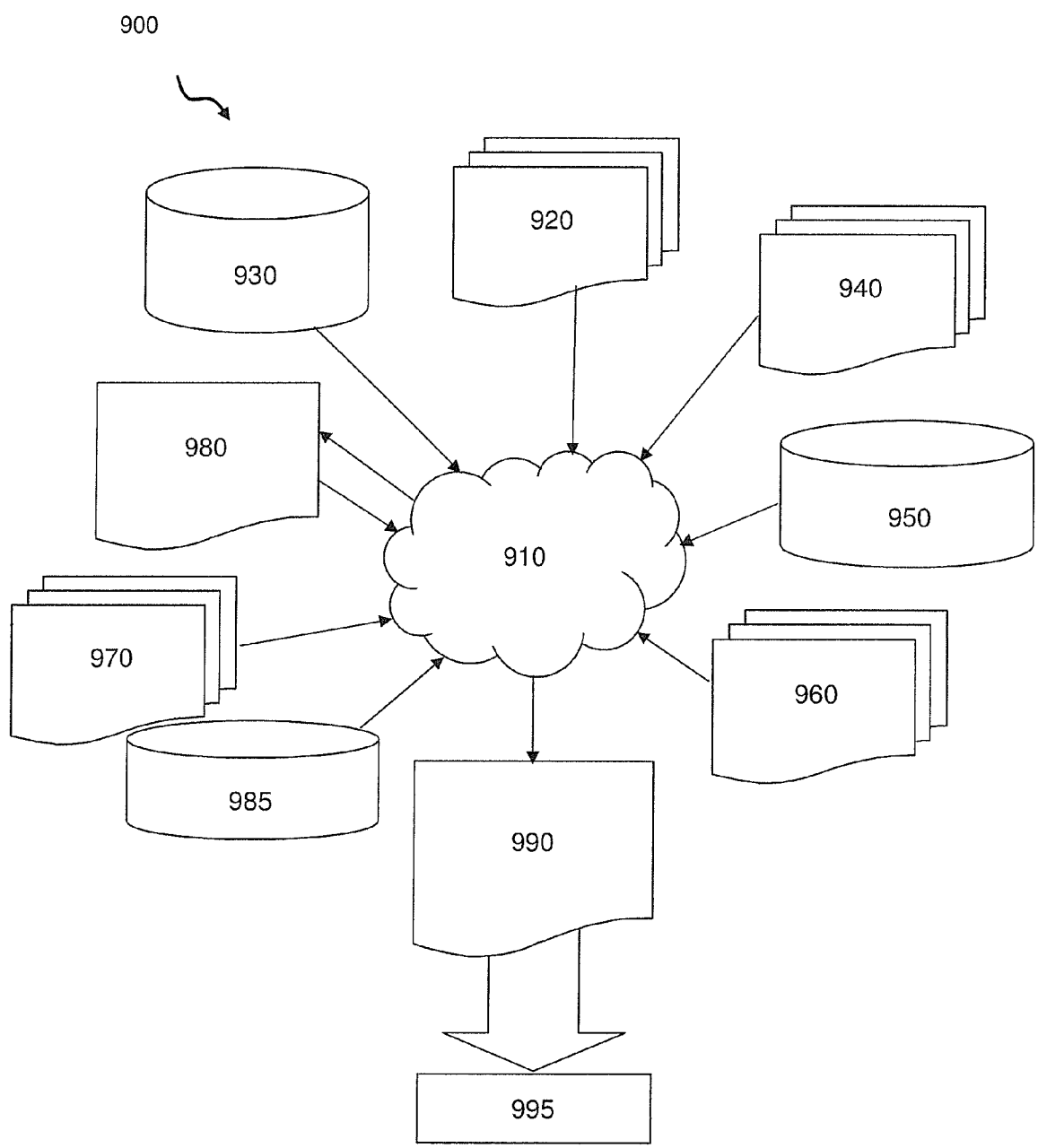
FIG. 8 is a flow diagram of a design process used in semiconductor design, manufacture, and/or test.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 990 may comprise a compiled, executable HDL simulation model that functionally simulates the devices shown in FIGS. 1-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 990 may then proceed to a stage 995 where, for example, design structure 990 proceeds to tape-out, is released to manufacturing, is released to a mask house, is sent to another design house, is sent back to the customer, etc.

The methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A MUGFET structure comprising:
    active regions comprising a first active region adjacent to a second active region; and
    a dual damascene replacement gate structure including:
        a lower portion having a gate thickness of about 30% or less of a distance between the first active region and the second active region; and
        an upper portion that is configured to strap the active regions,
    wherein the upper portion of the dual damascene replacement gate structure spans at least the distance between the first active region and the second active region.

2. The structure of claim 1, further comprising a dielectric material located between the first active region and the second active region and the lower portion of the dual damascene replacement gate structure.

3. The structure of claim 1, wherein the lower portion of the dual damascene replacement gate structure surrounding each active region is a dielectric material.

4. The structure of claim 1, wherein the active regions each have a height and a width, wherein the height is about 1.5 times the width.

5. The structure of claim 4, wherein the active regions are fins of the MUGFET.

6. The structure of claim 1, further comprising a dielectric and metal region surrounding the active regions.

7. The structure of claim 6, wherein the dielectric is one of: $SiO_2$, SiON, Hafnium and Zirconium.

8. The structure of claim 7, wherein the metal is TaN or TiN.

9. The structure of claim 1, wherein the active regions are planar.

10. The structure of claim 1, wherein the replacement gate straddles the active regions with dielectric material.

11. The structure of claim 10, wherein the dielectric material is located between the active regions.

12. The structure of claim 1, further comprising a dielectric material located between the first active region and the second active region, wherein the lower portion of the dual damascene replacement gate structure is located on both sides of the dielectric material and the upper portion of the dual damascene replacement gate structure covers the dielectric material.

13. The structure of claim 12, wherein a spacing and thickness of the dielectric material is configured such that the MUGFET structure has a capacitance depending on predetermined characteristics of the MUGFET structure.

14. A MUGFET structure comprising:
    active regions comprising a first active region adjacent to a second active region;
    a dual damascene replacement gate structure, comprising:
        a metal having a planar surface;
        a lower portion;
        an upper portion; and
        a dielectric and metal region surrounding the active regions; and
    a dielectric material located between the first active region and the second active region,
    wherein:
        the lower portion includes a gate thickness of about 30% or less of a distance between the first active region and the second active region;
        the upper portion straps the active regions;
        the upper portion spans at least the distance between the first active region and the second active region; and
        the active regions are fins of the MUGFET.

15. The structure of claim 14, wherein the lower portion of the dual damascene replacement gate structure surrounding each of the active regions is a dielectric material.

16. The structure of claim 15, wherein the active regions each have a height and a width, wherein the height is about 1.5 times the width.

17. The structure of claim 15, wherein the dielectric is one of: $SiO_2$, SiON, Hafnium and Zirconium and the metal is TaN or TiN.

* * * * *